United States Patent
Yu

(10) Patent No.: US 10,424,628 B2
(45) Date of Patent: Sep. 24, 2019

(54) MANUFACTURING METHOD OF OLED BACKPLANE

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventor: MingJiue Yu, Guangdong (CN)

(73) Assignee: SHENZHEN CHINA STAR OPTOELECTRONICS SEMICONDUCTOR DISPLAY TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 16/023,462

(22) Filed: Jun. 29, 2018

(65) Prior Publication Data

US 2019/0214445 A1     Jul. 11, 2019

Related U.S. Application Data

(63) Continuation of application No. PCT/CN2018/079001, filed on Mar. 14, 2018.

(30) Foreign Application Priority Data

Jan. 9, 2018 (CN) .......................... 2018 1 0017447

(51) Int. Cl.
- *H01L 29/08* (2006.01)
- *H01L 27/32* (2006.01)

(Continued)

(52) U.S. Cl.
CPC ...... *H01L 27/3258* (2013.01); *H01L 27/3246* (2013.01); *H01L 29/7869* (2013.01); *H01L 51/56* (2013.01); *H01L 2227/323* (2013.01)

(58) Field of Classification Search
CPC . H01L 27/32; H01L 27/3258; H01L 27/3246; H01L 29/7869; H01L 51/52; H01L 29/4908

See application file for complete search history.

(56) References Cited

U.S. PATENT DOCUMENTS

| 2006/0091399 A1* | 5/2006 | Lee | ................ H01L 27/12 257/72 |
| 2007/0152217 A1* | 7/2007 | Lai | ................ H01L 27/1225 257/59 |

(Continued)

*Primary Examiner* — Phuc T Dang
(74) *Attorney, Agent, or Firm* — Leong C. Lei

(57) ABSTRACT

The invention provides an OLED backplane manufacturing method, comprising: depositing a buffer layer on a glass substrate; depositing a first metal layer on the buffer layer, patterning the first metal layer to form a source, a drain and a lower electrode of storage capacitor; depositing a semiconductor layer on the buffer layer, and the semiconductor layer covering the source and the drain; depositing a gate insulating layer on the semiconductor layer; depositing a second metal layer on the gate insulating layer, patterning the second metal layer to obtain a gate and an upper electrode of storage capacitor; using the gate self-aligned to etch the gate insulating layer and the semiconductor layer to expose the source and the drain. The invention educes the number of masks required for OLED backplane manufacturing and effectively reduces the production cost of OLED backplane.

13 Claims, 2 Drawing Sheets

(51) Int. Cl.
*H01L 29/786* (2006.01)
*H01L 51/56* (2006.01)

(56) References Cited

U.S. PATENT DOCUMENTS

2008/0038884 A1* 2/2008 Hwang ............... H01L 27/1255
  438/155
2016/0351643 A1* 12/2016 Xie ..................... H01L 21/77

* cited by examiner

MANUFACTURING METHOD OF OLED BACKPLANE

CROSS REFERENCE TO RELATED APPLICATIONS

This application is a continuing application of PCT Patent Application No. PCT/CN2018/079001, entitled "OLED BACKPLANE AND MANUFACTURING METHOD THEREOF", filed on Mar. 14, 2018, which claims priority to Chinese Patent Application No. CN201810017447.8, filed on Jan. 9, 2018, both of which are hereby incorporated in its entireties by reference.

BACKGROUND OF THE INVENTION

1. Field of the Invention

The present invention relates to the field of display and, in particular, to the field of an OLED backplane and manufacturing method thereof.

2. The Related Arts

The conventional organic light-emitting diode (OLED) backplane generally adopts a top gate self-aligned oxide. As shown in FIG. 1, the OLED backplane comprises a buffer layer 2' on the glass substrate 1'. On top of the buffer layer 2', there are a semiconductor layer 3', a gate insulating layer 4', a gate 5', and a interlayer insulating layer 6', a source 8' and a drain 9' are electrically connected to the conductor region 31' on the semiconductor layer 3' through a via hole in the interlayer insulating layer 6', and a passivation layer 7' is provided on the interlayer insulating layer 6'. The passivation layer 7' covers the source 8' and the drain 9'.

In preparing the OLED backplane, five mask processes are needed to accomplish the preparation. The first mask process is used to pattern the semiconductor layer 3' to obtain the pattern in FIG. 1; the second mask process is used to pattern the gate metal layer to obtain the pattern of the gate 5' in FIG. 1; the third mask is used to pattern the interlayer insulating layer 6' to obtain the via hole; the fourth mask is used to pattern the source/drain metal layer to obtain the patterns of the source 8' and the drain 9' in FIG. 1; and the fifth mask process is used to pattern the passivation layer to obtain the via hole for subsequent connection between the ITO electrode on above the passivation layer to the drain.

Because five mask processes are needed in preparing OLED backplane, the manufacturing cost of OLED backplane is high and the preparation efficiency of the OLED backplane is reduced.

SUMMARY OF THE INVENTION

The primary object of the present invention is to provide an OLED backplane and manufacturing method thereof, able to reduce number of masks in the preparation process to reduce the manufacturing cost.

To solve the above technical issue, the present invention provides an OLED backplane manufacturing method, which comprises the steps of:

depositing a buffer layer on a glass substrate;

depositing a first metal layer on the buffer layer, patterning the first metal layer to form a source, a drain and a lower electrode of storage capacitor;

depositing a semiconductor layer on the buffer layer, and the semiconductor layer covering the source and the drain;

depositing a gate insulating layer on the semiconductor layer;

depositing a second metal layer on the gate insulating layer, patterning the second metal layer to obtain a gate and an upper electrode of storage capacitor;

using the gate self-aligned to etch the gate insulating layer and the semiconductor layer to expose the source and the drain.

Preferably, the method further comprises:

forming a passivation layer on the buffer layer, the passivation layer covering the source, the drain, the gate, the upper electrode of storage capacitor, and the lower electrode of storage capacitor.

Preferably, the method further comprises:

forming a planarization layer on the passivation layer;

forming via holes on the planarization layer and the passivation layer, also forming ITO electrode on the planarization layer, wherein the via hole on the planarization layer aligned with the via hole on the passivation layer and above the drain, the ITO electrode being electrically connected to the drain through the via hole on the planarization layer and the via hole on the passivation layer.

Preferably, the method further comprises:

forming a pixel definition layer on the planarization layer, and the pixel definition layer covering the ITO electrode;

patterning the pixel definition layer to at least partially expose the ITO electrode.

Preferably, the buffer layer is at least an SiOx layer and/or at least an SiNx layer;

and the buffer layer has a thickness of 1000-5000 Å.

Preferably, the gate insulating layer is at least an SiOx layer and/or at least an SiNx layer;

and the gate insulating layer has a thickness of 1000-3000 Å.

Preferably, the first metal layer and the second metal layer are made of ones of the following: Mo, Al, Cu, Ti, Mo alloys, Al alloys, Cu alloys, and Ti alloys;

the semiconductor layer is made of metal-oxide-semiconductor material, and the metal-oxide-semiconductor material is one of the following: IGZO, ITZO, and IGZTO.

The present invention also provides an OLED backplane manufacturing method, which comprises the steps of:

depositing a buffer layer on a glass substrate;

depositing a first metal layer on the buffer layer, patterning the first metal layer to form a source, a drain and a lower electrode of storage capacitor;

depositing a semiconductor layer on the buffer layer, and the semiconductor layer covering the source and the drain;

depositing a gate insulating layer on the semiconductor layer;

depositing a second metal layer on the gate insulating layer, patterning the second metal layer to obtain a gate and an upper electrode of storage capacitor;

using the gate self-aligned to etch the gate insulating layer and the semiconductor layer to expose the source and the drain;

wherein the buffer layer being at least an SiOx layer and/or at least an SiNx layer:

and the buffer layer having a thickness of 1000-5000 Å.

Preferably, the method further comprises:

forming a passivation layer on the buffer layer, the passivation layer covering the source, the drain, the gate, the upper electrode of storage capacitor, and the lower electrode of storage capacitor.

Preferably, the method further comprises:

forming a planarization layer on the passivation layer;

forming via holes on the planarization layer and the passivation layer, also forming ITO electrode on the planarization layer, wherein the via hole on the planarization layer aligned with the via hole on the passivation layer and above the drain, the ITO electrode being electrically connected to the drain through the via hole on the planarization layer and the via hole on the passivation layer.

Preferably, the method further comprises:

forming a pixel definition layer on the planarization layer, and the pixel definition layer covering the ITO electrode;

patterning the pixel definition layer to at least partially expose the ITO electrode.

Preferably, the gate insulating layer is at least an SiOx layer and/or at least an SiNx layer;

and the gate insulating layer has a thickness of 1000-3000 Å.

Preferably, the first metal layer and the second metal layer are made of ones of the following: Mo, Al, Cu, Ti, Mo alloys, Al alloys, Cu alloys, and Ti alloys;

the semiconductor layer is made of metal-oxide-semiconductor material, and the metal-oxide-semiconductor material is one of the following: IGZO, ITZO, and IGZTO.

The present invention also provides an OLED backplane, which comprises: a buffer layer, a source, a drain and a lower electrode of storage capacitor, all disposed on the buffer layer, a semiconductor layer disposed between the source and the drain, a gate insulating layer disposed on the semiconductor layer, and a gate and an upper electrode of storage capacitor, both disposed on the gate insulating layer.

Preferably, a passivation layer is disposed on the buffer layer, the passivation layer covers the source, the drain, the gate, the upper electrode of storage capacitor, and the lower electrode of storage capacitor;

a planarization layer is disposed on the passivation layer; both the planarization layer and the passivation layer are disposed with via holes, the via hole on the planarization layer is aligned with the via hole on the passivation layer and above the drain, an ITO electrode is disposed on the planarization layer, wherein the ITO electrode is electrically connected to the drain through the via hole on the planarization layer and the via hole on the passivation layer;

a pixel definition layer is disposed on the planarization layer, and the pixel definition layer is disposed with an opening and the opening is above the ITO electrode.

Preferably, the buffer layer is at least an SiOx layer and/or at least an SiNx layer and the buffer layer has a thickness of 1000-5000 Å;

the gate insulating layer is at least an SiOx layer and/or at least an SiNx layer and the gate insulating layer has a thickness of 1000-3000 Å;

the first metal layer and the second metal layer are made of ones of the following: Mo, Al, Cu, Ti, Mo alloys, Al alloys, Cu alloys, and Ti alloys;

the semiconductor layer is made of metal-oxide-semiconductor material, and the metal-oxide-semiconductor material is one of the following: IGZO, ITZO, and IGZTO.

The embodiments of the present invention provide the following advantages: the first metal layer is first patterned to obtain a source, a drain, and a lower electrode of storage capacitor. Then, the second metal layer is patterned to obtain a gate and an upper electrode of storage capacitor, and the patterned second metal layer (including the gate) is used to self-aligned to etch the gate insulating layer and the semiconductor layer. Compared with the known OLED backplane preparation method, the mask process required for patterning the semiconductor layer is reduced, and the preparation of the interlayer insulating layer is reduced, and the masks for preparing the interlayer insulating layer and via hole on the interlayer insulating layer are eliminated. Therefore, the present invention can reduce the masks needed during preparing the OLED backplane, and can effectively reduce the production cost of the OLED backplane.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort.

DETAILED DESCRIPTION OF THE PREFERRED EMBODIMENTS

To further explain the technical means and effect of the present invention, the following refers to embodiments and drawings for detailed description, Apparently, the described embodiments are merely some embodiments of the present invention, instead of all embodiments. All other embodiments based on embodiments in the present invention and obtained by those skilled in the art without departing from the creative work of the present invention are within the scope of the present invention.

The terms "comprising" and "having" and any variations thereof appearing in the specification, claims, and drawings of the present application are intended to cover non-exclusive inclusion. For example, a process, method, system, product, or device that includes a series of steps or units is not limited to the listed steps or units, but optionally also includes steps or units not listed, or alternatively, other steps or units inherent to these processes, methods, products or equipment. In addition, the terms "first", "second" and "third" are used to distinguish different objects and not intended to describe a particular order.

Figure 1:
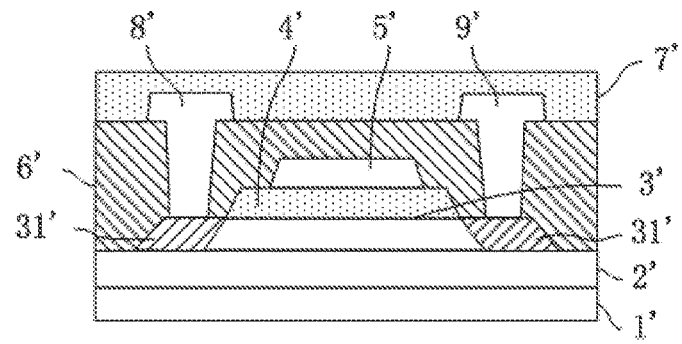
FIG. 1 is a schematic view showing the structure of a known OLED backplane.
Figure 2:
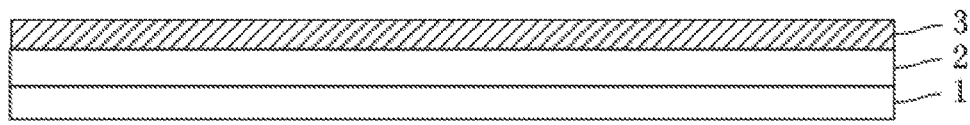
FIG. 2 is a schematic view showing the deposition of a first metal layer on the buffer layer according to an embodiment of the present invention.
Figure 3:
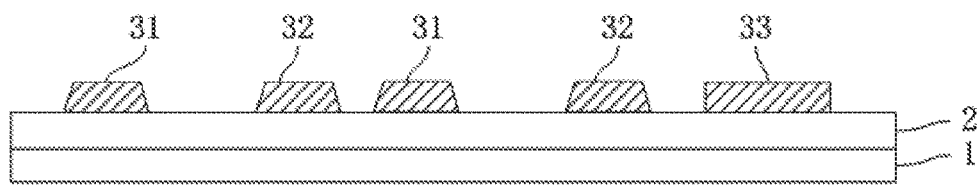
FIG. 3 is a schematic view showing patterning the first metal layer in FIG. 2.
Figure 4:
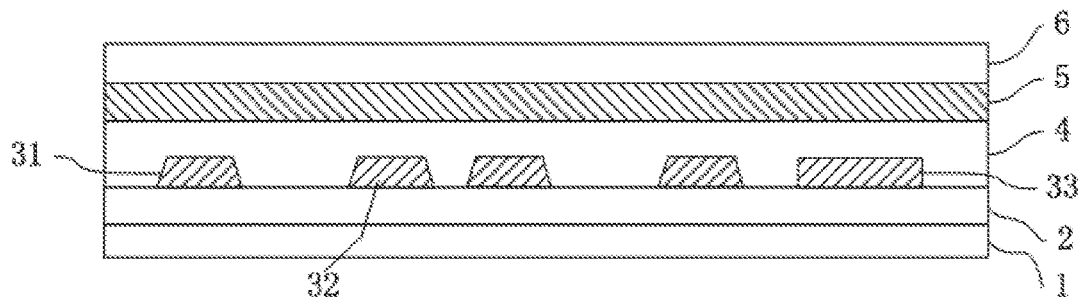
FIG. 4 is a schematic view showing the semiconductor layer, the gate insulating layer, and the second metal layer according to an embodiment of the present invention.
Figure 5:
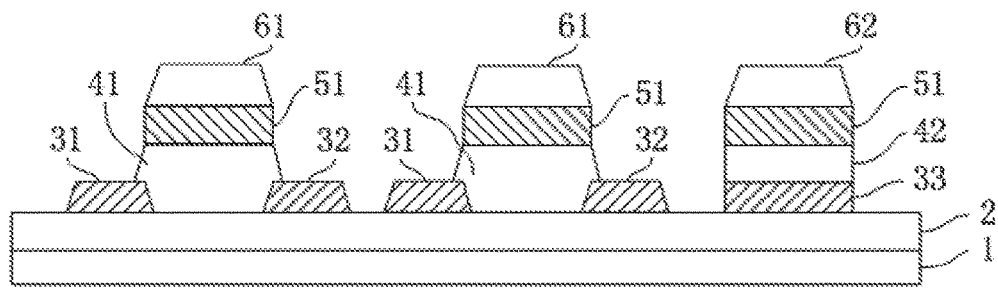
FIG. 5 is a schematic view showing patterning the second metal layer, and etching the gate insulating layer and the semiconductor according to an embodiment of the present invention.

The present invention provides an OLEO backplane manufacturing method, which comprises the steps of:

as shown in FIG. 2, depositing a buffer layer 2 on a glass substrate 1;

depositing a first metal layer 3 on the buffer layer 2, patterning the first metal layer 3, as shown in FIG. 3, to form a source 31, a drain 32 and a lower electrode 33 of storage capacitor;

as shown in FIG. 4, depositing a semiconductor layer 4 on the buffer layer 2, and the semiconductor layer 4 covering the source 31, the drain 32, and lower electrode 33 of storage capacitor;

depositing a gate insulating layer 5 on the semiconductor layer 4;

depositing a second metal layer 6 on the gate insulating layer 5, patterning the second metal layer 6, as shown in FIG. 5, to obtain a gate 61 and an upper electrode 62 of storage capacitor; specifically, coating a photoresist layer on the second metal layer 6, using lithography to pattern the photoresist layer to form a photoresist pattern, using the photoresist pattern as a stopping layer to perform etching on the second metal layer to form the gate 61 and the upper electrode 62 of storage capacitor. The upper electrode 62 of storage capacitor and the lower electrode 33 of storage capacitor together form a storage capacitor Cst.

The next step is to use the gate 61 self-aligned to etch the gate insulating layer 5 and the semiconductor layer 4 to expose the source 31 and the drain 32. FIG. 5 shows the post-etched gate insulating layer 51, and the post-etched semiconductor layer 41, 42.

Moreover, the OLED backplane manufacturing method further comprises the following step:

using the upper electrode 62 of storage capacitor self-aligned to etch the gate insulating layer 5 and the semiconductor layer 4 to expose the lower electrode 33 of storage capacitor.

Figure 6:
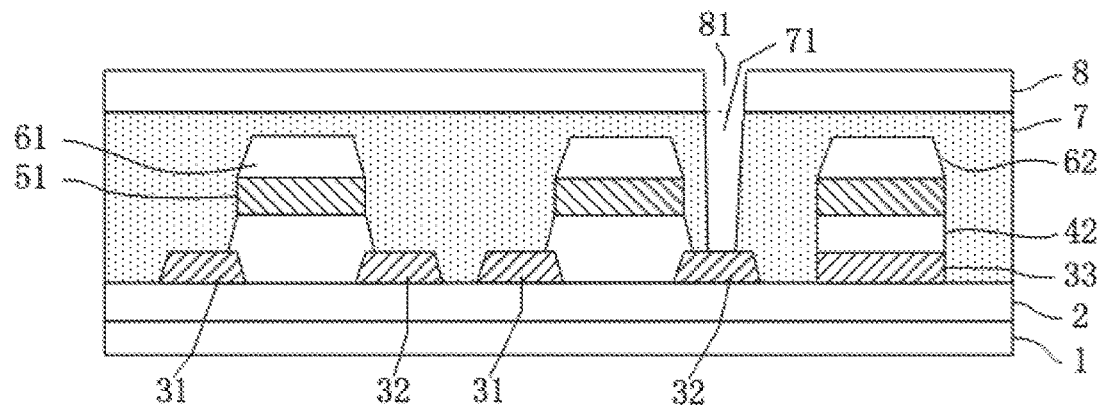
FIG. 6 is a schematic view showing the passivation layer and the planarization layer according to an embodiment of the present invention

As shown in FIG. 6, the next step is to form a passivation layer 7 on the buffer layer 2, the passivation layer 7 covering the source 31, the drain 32, the gate 61, the upper electrode 62 of storage capacitor, and the lower electrode 33 of storage capacitor.

Then, the gate 61 is used for self-aligned etching the gate insulating layer 5 and the semiconductor layer 4, or the upper electrode 62 of storage capacitor is used for self-aligned etching the gate insulating layer 5 and the semiconductor layer 4. Specifically, when etching the gate insulating layer 5 and the semiconductor layer 4, the gate 61 or the upper electrode 62 of storage capacitor is used as a stopping layer to prevent the gate insulating layer 5 and the semiconductor layer 4 underneath the gate 61 or the upper electrode 62 of storage capacitor from being etched away.

Figure 7:
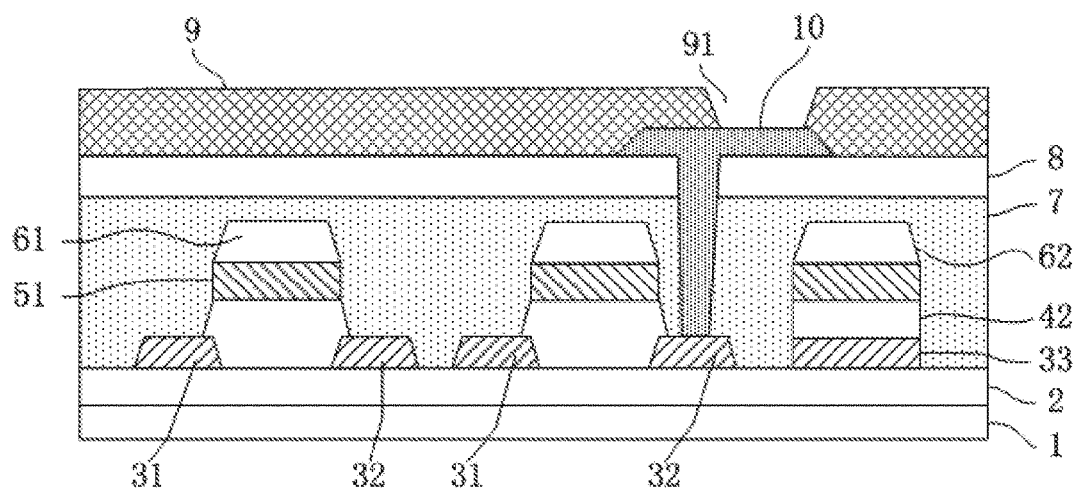
FIG. 7 is a schematic view showing the structure of the OLED backplane according to an embodiment of the present invention.

Moreover, the OLED backplane manufacturing method further comprises the following step:

forming a planarization layer 8 on the passivation layer 7;

forming via holes 81, 71 on the planarization layer 8 and the passivation layer 7, as shown in FIG. 7, also forming indium-tin-oxide (ITO) electrode 10 on the planarization layer 8, wherein the via hole 81 being aligned with the via hole 71 and both being above the drain 32, the ITO electrode 10 being electrically connected to the drain 32 through the via hole 81 on the planarization layer 8 and the via hole 71 on the passivation layer 7.

Moreover, the OLED backplane manufacturing method further comprises the following step:

forming a pixel definition layer 9 on the planarization layer 8, and the pixel definition layer 9 covering the ITO electrode 10;

patterning the pixel definition layer 9 to at least partially expose the ITO electrode 10 for electrically connecting to other conductors.

Moreover, the buffer layer 2 is at least an SiOx layer and/or at least an SiNx layer; and the buffer layer 2 has a thickness of 1000-5000 Å, wherein x>1.

Moreover, the gate insulating layer 5 is at least an SiOx layer and/or at least an SiNx layer; and the gate insulating layer 5 has a thickness of 1000-3000 Å.

Moreover, the first metal layer 3 and the second metal layer 6 are made of ones of the following: Mo, Al, Cu Ti, Mo alloys, Al alloys, Cu alloys, and Ti alloys.

The semiconductor layer 4 is made of metal-oxide-semiconductor material, and the metal-oxide-semiconductor material is one of the following: IGZO, ITZO, and IGZTO.

The present invention also provides an OLED backplane, as shown in FIG. 7, which comprises: a buffer layer 2, a source 31, a drain 32 and a lower electrode 33 of storage capacitor, all disposed on the buffer layer 2, a semiconductor layer 4 disposed between the source 31 and the drain 32, a gate insulating layer 5 disposed on the semiconductor layer 4, and a gate 61 and an upper electrode 62 of storage capacitor, both disposed on the gate insulating layer 5. The patterned semiconductor layer 41, the patterned insulating layer 51 and the gate 61 together form a thin film transistor (TFT).

FIG. 7 shows the OLED backplane structure corresponding to a 2T1C driving circuit; that is, a pixel comprises two TFTs and a storage capacitor, wherein one of the two TFTs is used as a driving TFT and the other as a switch TFT.

Moreover, a passivation layer 7 is disposed on the buffer layer 2, the passivation layer 7 covers the source 31, the drain 32, the gate 61, the upper electrode 62 of storage capacitor, and the lower electrode 33 of storage capacitor.

As shown in FIG. 6, a planarization layer 8 is disposed on the passivation layer 7: both the planarization layer 8 and the passivation layer 7 are disposed with via holes, the via hole 81 on the planarization layer 8 is aligned with the via hole 71 on the passivation layer 7 and both the vi holes 81, 71 are above the drain, an ITO electrode 10 is disposed on the planarization layer 8, wherein the ITO electrode 10 is electrically connected to the drain 32 through the via hole 81 on the planarization layer 8 and the via hole 71 on the passivation layer 7.

A pixel definition layer 9 is disposed on the planarization layer 8, and the pixel definition layer 9 is disposed with an opening 91 and the opening 91 is above the ITO electrode 10 to at least partially expose the ITO electrode 10 for electrical connection to other conductors.

Moreover, the buffer layer 2 is at least an SiOx layer and/or at east an SiNx layer and the buffer layer 2 has a thickness of 1000-5000 Å.

The gate insulating layer 5 is at least an SiOx layer and/or at least an SiNx layer and the gate insulating layer 5 has a thickness of 1000-3000 Å.

The gate 61, the source 31 and the drain 32 are made of ones of the following: Mo, Al, Cu, Ti, Mo alloys, Al alloys, Cu alloys, and Ti alloys, The semiconductor layer 4 is made of metal-oxide-semiconductor material, and the metal-oxide-semiconductor material is one of the following: IGZO, ITZO, and IGZTO.

In the present invention, when patterning the film layers (such as, the first metal layer 3, the second metal layer 6, the pixel definition layer 9), a photoresist layer is first coated on the film layer, then the lithography and mask are used to perform exposure to the photoresist, and the photoresist is developed. The developed photoresist is used as a stopping layer to etch the film layer. Therefore, a mask is required for each patterning process on the film layer.

In summary, present invention uses a top gate self-aligned structure. The first metal layer 3 is first patterned to obtain a source 31, a drain 32, and a lower electrode 33 of storage capacitor. Then, the second metal layer 6 is patterned to obtain a gate 61 and an upper electrode 62 of storage capacitor, and the patterned second metal layer (including the gate 61 and the upper electrode 62 of storage capacitor) is used to self-aligned to etch the gate insulating layer 5 and the semiconductor layer 4. Compared with the known OLED backplane preparation method, the mask process required for patterning the semiconductor layer 4 is reduced, and the preparation of the interlayer insulating layer is reduced, and the masks for preparing the interlayer insulating layer and via hole on the interlayer insulating layer are eliminated. Therefore, the present invention can reduce the masks needed by two for preparing the OLED backplane, and can effectively reduce the production cost of the OLED backplane.

It should be noted that each of the embodiments in this specification is described in a progressive manner, each of which is primarily described in connection with other embodiments with emphasis on the difference parts, and the same or similar parts may be seen from each other. For the device embodiment, since it is substantially similar to the method embodiment, the description is relatively simple and the relevant description may be described in part of the method embodiment.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claim of the present invention.

What is claimed is:

1. A manufacturing method of organic light-emitting diode (OLED) backplane, comprising:
    depositing a buffer layer on a glass substrate;
    depositing a first metal layer on the buffer layer, patterning the first metal layer to form a source, a drain and a lower electrode of storage capacitor;
    depositing a semiconductor layer on the buffer layer, and the semiconductor layer covering the source and the drain;
    depositing a gate insulating layer on the semiconductor layer;
    depositing a second metal layer on the gate insulating layer, patterning the second metal layer to obtain a gate and an upper electrode of storage capacitor;
    using the gate self-aligned to etch the gate insulating layer and the semiconductor layer to expose the source and the drain.

2. The manufacturing method of OLED backplane as claimed in claim 1, further comprising:
    forming a passivation layer on the buffer layer, the passivation layer covering the source, the drain, the gate, the upper electrode of storage capacitor, and the lower electrode of storage capacitor.

3. The manufacturing method of OLED backplane as claimed in claim 2, further comprising:
    forming a planarization layer on the passivation layer;
    forming via holes on the planarization layer and the passivation layer, also forming an indium-tin-oxide (ITO) electrode on the planarization layer, wherein the via hole on the planarization layer aligned with the via hole on the passivation layer and above the drain, the ITO electrode being electrically connected to the drain through the via hole on the planarization layer and the via hole on the passivation layer.

4. The manufacturing method of OLED backplane as claimed in claim 3, further comprising:
    forming a pixel definition layer on the planarization layer, and the pixel definition layer covering the ITO electrode;
    patterning the pixel definition layer to at least partially expose the ITO electrode.

5. The manufacturing method of OLED backplane as claimed in claim 1, wherein the buffer layer is at least an SiOx layer and/or at least an SiNx layer; and the buffer layer has a thickness of 1000-5000 Å.

6. The manufacturing method of OLED backplane as claimed in claim 1, wherein the gate insulating layer is at least an SiOx layer and/or at least an SiNx layer; and the gate insulating layer has a thickness of 1000-3000 Å.

7. The manufacturing method of OLED backplane as claimed in claim 1, wherein the first metal layer and the second metal layer are made of ones of the following: Mo, Al, Cu, Ti, Mo alloys, Al alloys, Cu alloys, and Ti alloys;
    the semiconductor layer is made of metal-oxide-semiconductor material, and the metal-oxide-semiconductor material is one of the following: IGZO, ITZO, and IGZTO.

8. A manufacturing method of organic light-emitting diode (OLED) backplane, comprising:
    depositing a buffer layer on a glass substrate;
    depositing a first metal layer on the buffer layer, patterning the first metal layer to form a source, a drain and a lower electrode of storage capacitor;
    depositing a semiconductor layer on the buffer layer, and the semiconductor layer covering the source and the drain;
    depositing a gate insulating layer on the semiconductor layer;
    depositing a second metal layer on the gate insulating layer, patterning the second metal layer to obtain a gate and an upper electrode of storage capacitor;
    using the gate self-aligned to etch the gate insulating layer and the semiconductor layer to expose the source and the drain;
    wherein the buffer layer is at least an SiOx layer and/or at least an SiNx layer;
    and the buffer layer has a thickness of 1000-5000 Å.

9. The manufacturing method of OLED backplane as claimed in claim 8, further comprising:
    Ruining a passivation layer on the buffer layer, the passivation layer covering the source, the drain, the gate, the upper electrode of storage capacitor, and the lower electrode of storage capacitor.

10. The manufacturing method of OLED backplane as claimed in claim 9, further comprising:
    forming a planarization layer on the passivation layer;
    forming via holes on the planarization layer and the passivation layer, also forming an indium-tin-oxide (ITO) electrode on the planarization layer, wherein the via hole on the planarization layer aligned with the via hole on the passivation layer and above the drain, the ITO electrode being electrically connected to the drain through the via hole on the planarization layer and the via hole on the passivation layer.

11. The manufacturing method of OLED backplane as claimed in claim 10, further comprising:

forming a pixel definition layer on the planarization layer, and the pixel definition layer covering the ITO electrode;

patterning the pixel definition layer to at least partially expose the ITO electrode.

12. The manufacturing method of OLED backplane as claimed in claim 8, wherein the gate insulating layer is at least an SiOx layer and/or at least an SiNx layer;

and the gate insulating layer has a thickness of 1000-3000 Å.

13. The manufacturing method of OLED backplane as claimed in claim 8, wherein the first metal layer and the second metal layer are made of ones of the following: Mo, Al, Cu, Ti, Mo alloys, Al alloys, Cu alloys, and Ti alloys;

the semiconductor layer is made of metal-oxide-semiconductor material, and the metal-oxide-semiconductor material is one of the following: IGZO, ITZO, and IGZTO.

* * * * *